United States Patent [19]

Akahori et al.

[11] Patent Number: 5,213,653

[45] Date of Patent: May 25, 1993

[54] WASTE TAPE DISPOSING MEANS OF TAPE FEEDER

[75] Inventors: Masahiro Akahori; Tuneji Togami, both of Iwata, Japan

[73] Assignee: Yamaha Hatsudoki Kabushiki Kaisha, Iwata, Japan

[21] Appl. No.: 712,487

[22] Filed: Jun. 10, 1991

[30] Foreign Application Priority Data

Sep. 5, 1990 [JP] Japan .................................. 2-236037

[51] Int. Cl.⁵ .............................................. B65H 5/28
[52] U.S. Cl. ...................................... 156/584; 221/71
[58] Field of Search ................. 156/344, 584; 221/71, 221/74; 226/5, 8, 52, 115, 120

[56] References Cited

U.S. PATENT DOCUMENTS

4,586,670  5/1986  Vancelette et al. ............ 226/120 X
5,024,720  6/1991  Boss et al. ..................... 156/584

Primary Examiner—David A. Simmons
Assistant Examiner—Mark A. Osele
Attorney, Agent, or Firm—Ernest A. Beutler

[57] ABSTRACT

A tape feed and dispensing mechanism for feeding a tape containing a carrier strip carrying articles to be dispensed and a protective covering for covering the carrier strip and retaining the articles upon it. A stripping device strips the covering strip from the carrier strip to access the carried parts. A disposal mechanism is provided that returns the stripped covering strip to a disposal area beneath the tape being fed and this includes an arrangement for turning the tape through 90° as it passes by the strip of tape being fed. In one embodiment, the carrier strip is also returned to the same disposal area so that both strips can be disposed of at the same time.

9 Claims, 5 Drawing Sheets

WASTE TAPE DISPOSING MEANS OF TAPE FEEDER

BACKGROUND OF THE INVENTION

This invention relates to a waste tape disposing means of a tape feeder and more particularly to an improved arrangement for disposing of waste tape from a tape feeding mechanism.

One commonly employed form of assembling mechanism employs small parts that are fed on a tape and which are protected within a protective cover. This protective cover is stripped back from the tape during the feeding operation so as to access the parts carried on the tape. Generally, the tape containing the parts is wound onto a feed roll and is fed to the assembly apparatus. A stripping mechanism is positioned forwardly of the feed roll and the protective cover is stripped back and then rolled onto a take-up roll for disposal. Generally, these take-up rolls are disposed immediately above the feed tape and hence have limited capability for holding the stripped protective cover.

Figure 1:
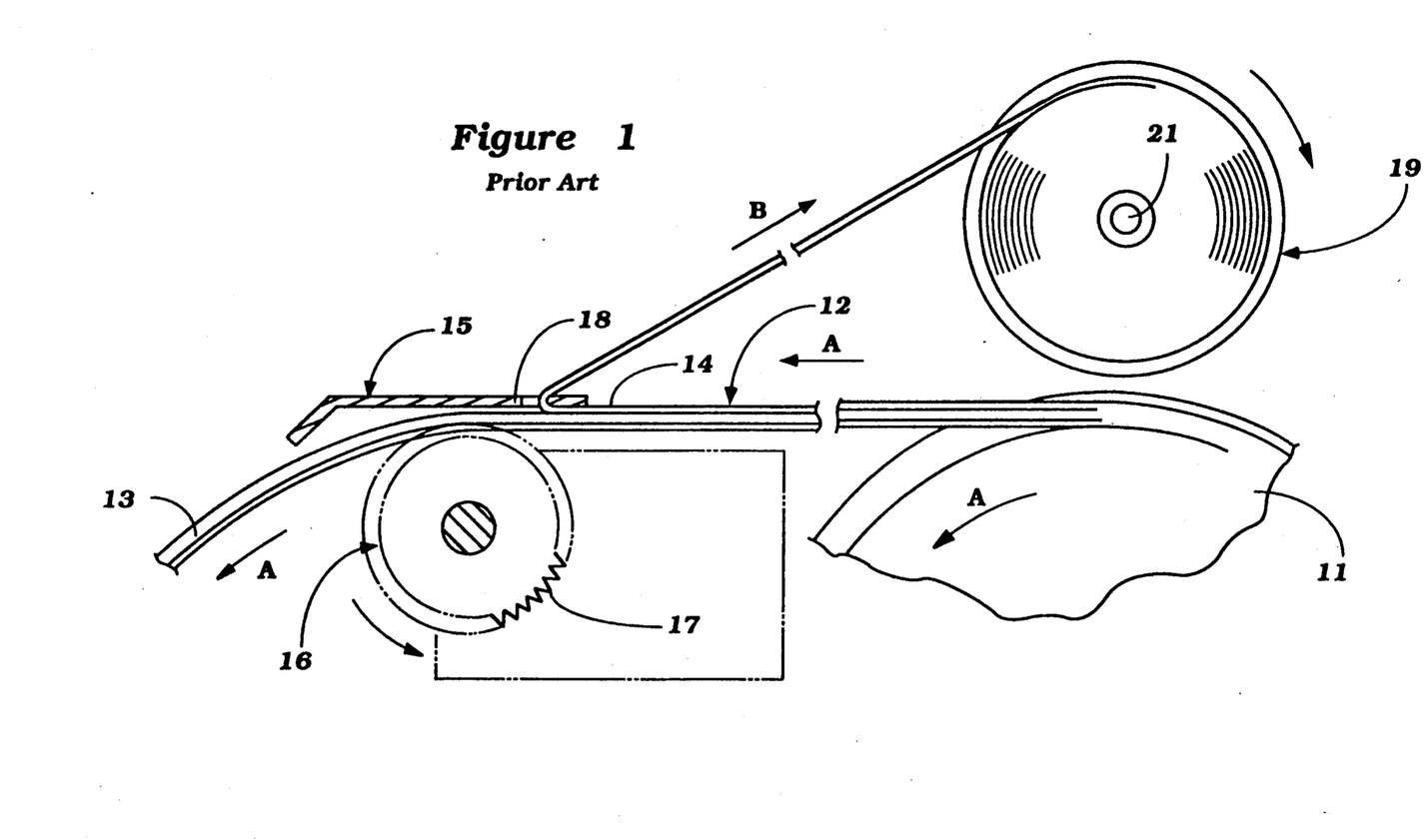
FIG. 1 is a side elevational view of the tape feeding and stripping portion of a tape feeding apparatus constructed in accordance with a type of prior art construction.

This arrangement may be best understood by reference to FIG. 1 which is a figure showing a prior art type of feed and waste tape take-up mechanism. As may be seen in this Figure, a feed tape roll, indicated generally by the reference numeral 11 is provided on which a tape, indicated generally by the reference numeral 12 is wound. The feed roll 11 is supported for rotation in a feed direction about an axis, with the direction of feed being indicated by the arrow A.

The tape 12 includes a backing or carrier portion 13 which is formed with individual recesses, which will be discussed and described later in the specification, in which parts to be assembled are contained. A protective cover film 14 is provided over the carrier tape 13 and is intended to hold these small parts in position.

The parts carried on the carrier tape 13 are normally, as noted, small parts and may include components that will be employed and added onto a printed circuit board to provide a functional circuit. The parts to be assembled may, for example, be integrated chips or the like.

A stripper mechanism, indicated generally by the reference numeral 15 is positioned in the line of feed of the tape from the feed roll 11 and is positioned adjacent a back-up roller, indicated generally by the reference numeral 16, which may also drive the tape 12 in a feed direction and which has driving teeth 17 for this purpose.

The stripping mechanism 15 is provided with a slot 18 through which the protective cover 14 is fed and then is returned back onto a take-up roll, indicated generally by the reference numeral 19 and which is supported for rotation about an axis 21. The take-up roll 19 may be driven in an appropriate manner.

As may be readily apparent from the illustrated prior art construction, the positioning of the take-up roller 19 next to the feed roller 11 dictates a small diameter for the take-up roller. Therefore, the apparatus must be stopped quite frequently in order to permit new take-up rollers to be inserted and the older take-up roller being disposed. Said another way, this type of prior art construction does not permit continuous operation because of the necessity of periodically stopping the equipment to remove the filled up take-up roller.

It is, therefore, a principal object of this invention to provide an improved waste tape disposing means for a tape feeder.

It is a further object of this invention to provide a waste tape disposing means for a tape feeder that will permit continuous operation.

It is a further object of this invention to provide a waste tape disposing means for a tape feeder wherein the waste tape may be transported to a remote area and easily disposed of without encumbering the equipment.

In addition to the necessity of removing and disposing of the protective cover, the carrier tape also must be transported to a disposal area once the individual pieces have been removed from it. Normally this has been done by removing the back-up or carrier tape to a different area and possibly winding it on a further take-up roller. Hence, the protective cover and carrier tape are transported to different locations and must be disposed of separately. This obviously complicates the mechanism and does not permit a compact assembly.

It is, therefore, a still further object of this invention to provide a waste tape disposing structure wherein both a protective tape and a carrier tape may be removed to the same location and disposed of simultaneously.

It is a further object of this invention to provide a waste tape disposing means wherein both waste carrier and protective tapes can be reassembled and disposed of together.

SUMMARY OF THE INVENTION

A first feature of the invention is adapted to be embodied in a tape dispenser and disposal system comprised of tape feeding means for feeding a tape comprised of a carrier strip and removable covering strip in a generally horizontal direction to a stripping section. Stripping means are provided at the stripping section for removing the covering strip from the carrier strip and redirecting the covering strip in a direction generally opposite to the direction the tape is fed by the feeding mechanism. A disposal area is positioned beneath the tape being fed by the feed means and disposal means transfer the remove covering strip from above the tape being fed to the disposal area.

Another feature of the invention is also adapted to be embodied in a tape dispensing and disposing system comprising tape feeding means for feeding a tape comprising a carrier strip and a removable covering strip to a stripping station. At the stripping station there is provided a stripping means that removes the covering strip from the carrier strip and redirects the covering strip in a disposal direction. Means are provided for delivering both the carrier strip and the stripped covering strip to the same area for disposal.

DETAILED DESCRIPTION OF THE PREFERRED EMBODIMENT OF THE DRAWINGS

Referring first to the embodiment of FIGS. 2 through 5, it is to be understood that this embodiment is intended to for use in the same general type of apparatus as was discussed in conjunction with the description in the background of the invention portion dealing with the prior art construction of FIG. 1. That is, there is provided a feed tape roll (not shown) from which a tape 12 is fed in the direction of feed indicated by the arrow A. As with the prior art type of construction, the tape being fed toward the stripping mechanism, again indicated by the reference numeral 15, is in a generally horizontally disposed direction. In the embodiment of the invention as will be described, those components which are the same as the prior art components already described have been identified by the same reference numerals.

Figure 3:
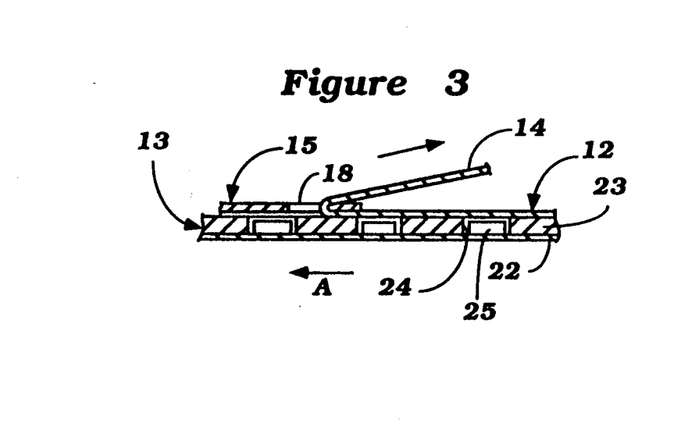
FIG. 3 is an enlarged cross-sectional view taken through the stripping mechanism and shows the tape construction.
Figure 4:
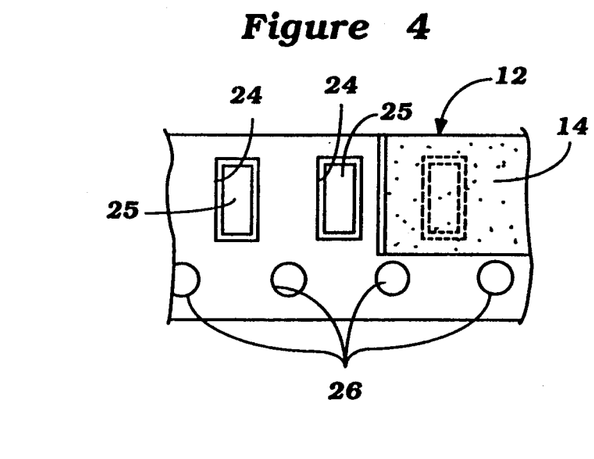
FIG. 4 is an enlarged top plan view showing the tape with a portion of the protective covering strip removed.
Figure 5:
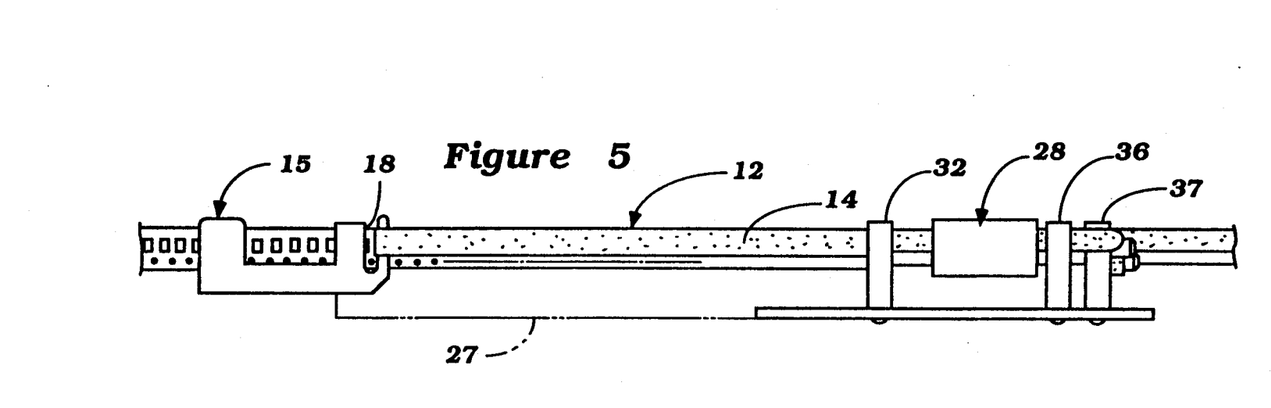
FIG. 5 is a top plan view of the mechanism shown in FIG. 2.

Referring in detail to FIGS. 3 and 4, the nature of the tape 12 and its construction may be better understood. As has been previously noted, the tape 12 is comprised of a carrier strip 13 that is comprised of a backing portion 22 and a further portion 23 that defines a plurality of recesses 24 in which small parts to be assembled, indicated generally by the reference numeral 25 are contained. As previously noted, the parts 25 may be individual chips to be assembled onto a printed circuit board by a suitable assembly apparatus (not shown). As may be seen in FIG. 4, at one side of the carrier strip 13 there is provided perforations 26 that cooperate with the teeth 17 of the driver roll 16 for advancing the tape 12. There is no protective covering strip 14 over the area of the tape in which the perforations 26 are formed.

Certain of the components which form a portion of the mechanism comprising the invention are mounted on a base assembly, which is shown in phantom and is identified generally by the reference numeral 27. This frame construction may take any suitable construction and only certain components of it will be described and only insofar as is necessary to permit those skilled in the art to understand the operation of the mechanism.

Figure 2:
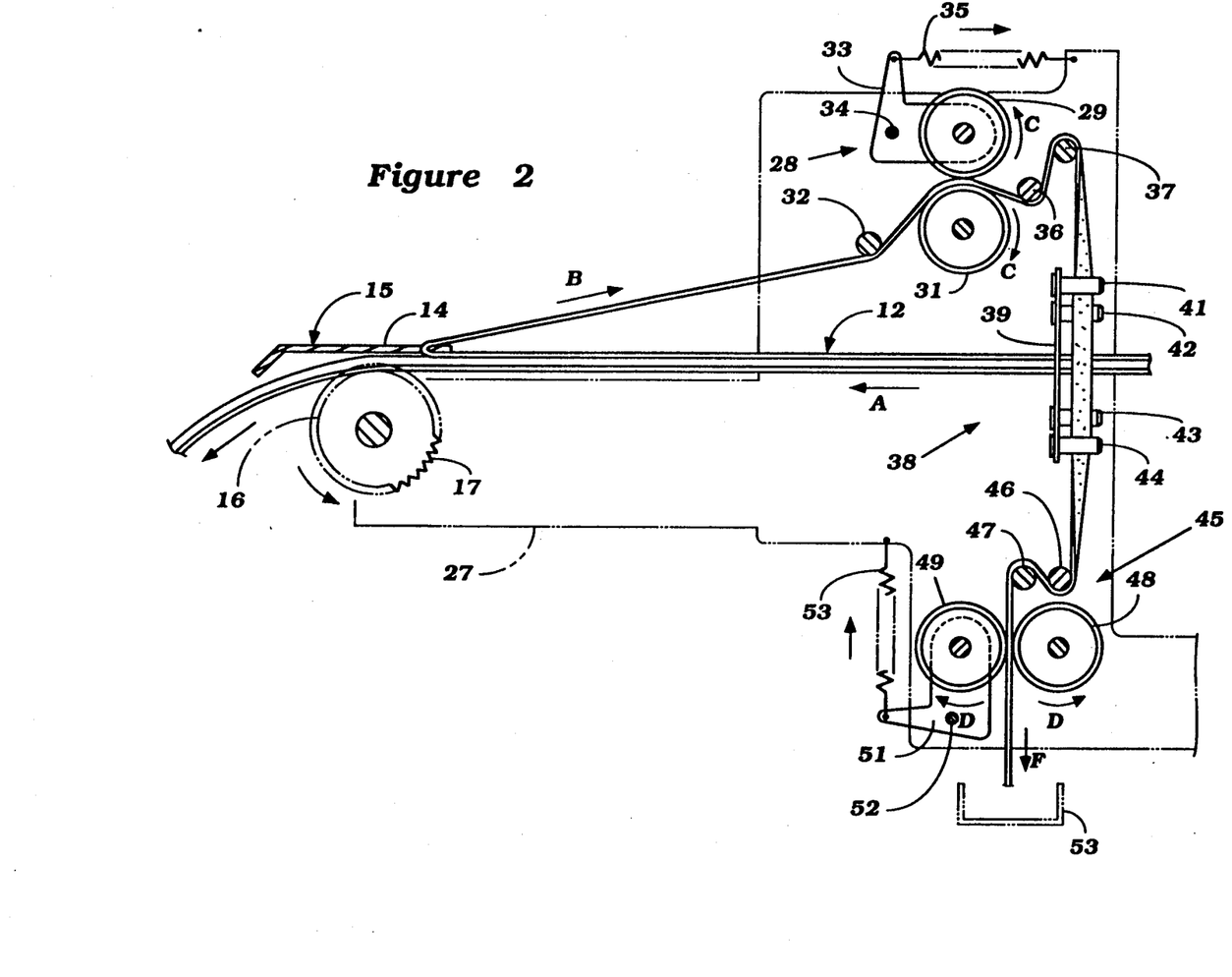
FIG. 2 is a side elevational view, in part similar to FIG. 1, and shows a tape disposal arrangement constructed in accordance with a first embodiment of the invention.

As with the conventional type of tape dispensing mechanism, the stripped protective covering 14 is returned above the direction of feed of the tape 12 as indicated by the arrow B. This return protective covering 14 from the stripper 15 passes generally over the tape 12 being fed.

The stripped covering strip is drawn in the direction of the arrow B by a stripping drive roller assembly, indicated generally by the reference numeral 28. This stripping drive roller assembly 28 includes a pair of rollers 29 and 31 that are disposed on opposite sides of the cover strip 14 and positioned above the tape 12 between the feed roller (not shown) and the stripping mechanism 15. A guide pin 32 is positioned forwardly of the stripping drive roller assembly 28 for delivering and redirecting the covering strip 14 to the area between the rollers 29 and 31. The roller 29 is mounted on a lever 33 that is pivotal about a pivot pin 34 on the frame 27 and which is biased by means of a spring 35 so as to maintain a uniform tension between the rollers 29 and 31. One or both of the rollers 29 and 31 are driven in the direction of the arrows C so as to affect the stripping off of the cover strip 14 in the direction B.

A pair of guide pins 36 and 37 are disposed rearwardly of the stripping drive roller assembly 28 and direct the stripped cover strip 14 in a generally upward direction.

Positioned in proximity to the side of the tape 12 being fed in the horizontal direction is a tape turning mechanism, indicated generally by the reference numeral 38. This tape turning mechanism 38 serves the function of rotating or bending the stripped cover strip 14 from a horizontal direction parallel to the direction of feed A and in a vertically downward direction so that the cover strip can be turned and positioned closely adjacent the tape being fed as may be clearly seen in FIG. 2. This permits a very compact arrangement.

The turning mechanism 38 includes a mounting plate 39 that is mounted appropriately on the frame 27 and which has a pair of upper guide pins 41 and 42 and lower guide pins 43 and 44 that have their axes extending parallel to the direction of tape feed A. The stripped cover strip 14 will then be turned so as to pass close to the side of this tape, as aforenoted.

A disposer feed mechanism, indicated generally by the reference numeral 45 is positioned below the horizontal feed area of the tape and below the stripping drive roller assembly 28. This mechanism includes a pair of guide pins 46 and 47 that again turn the stripped cover strip 14 back in its previous orientation and a pair of disposal driving rollers 48 and 49. The roller 49 is journaled on a lever 51 which is pivotally supported on the frame 27 by means of a pivot pin 52. A tensioning spring 53 maintains uniform tension between the rollers 48 and 49. The rollers 48 and/or 49 are driven in the direction of the arrows D so as to the draw the removed cover strip 14 downwardly in the direction of the arrow F for delivery to a disposal bin 53. As a result of this construction, it should be readily apparent that the cover strip 14 may be removed to an area below the feed mechanism and stripping mechanism and hence can be stored in a large area without necessitating a frequent replacement of take-up rolls as with the prior art constructions. In addition, because of the fact that the cover strip is turned as it passes by the tape 12 being fed in the horizontal direction A the machine can be quite compact.

Figure 6:
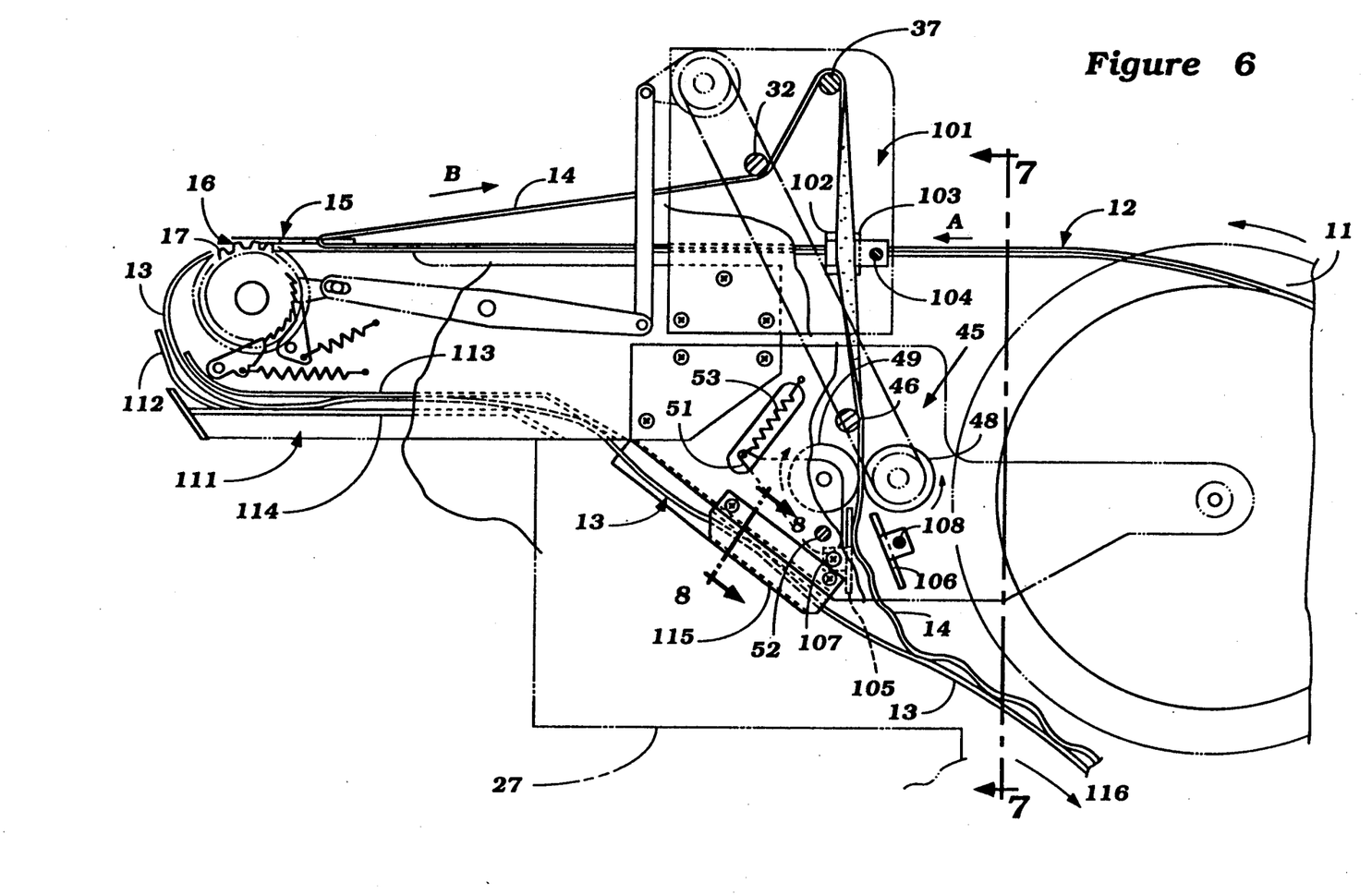
FIG. 6 is a side elevational view, in part similar to FIGS. 1 and 2, and shows a second embodiment of the invention wherein the protective covering and carrier strip are both disposed together.
Figure 7:
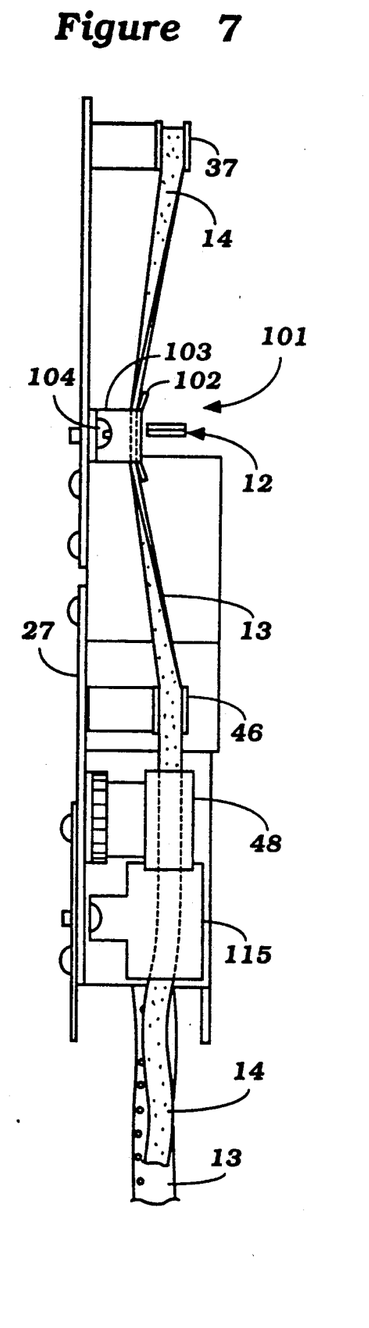
FIG. 7 is a cross-sectional view taken along the lines 7—7 of FIG. 6.
Figure 8:
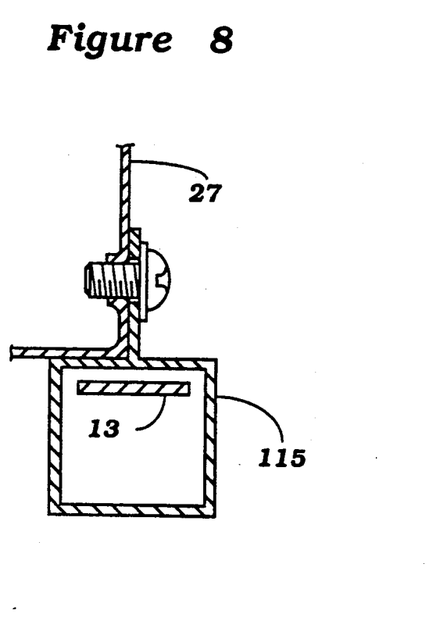
FIG. 8 is a cross-sectional view taken along the lines 8—8 of FIG. 6.

In the embodiment of the invention as thus far described, the disposal of the carrier tape 13 may be of the type previously used. However, such an arrangement requires separate disposal of the carrier tape 13 from the protective covering strip 14. FIGS. 6 through 8 show another embodiment of the invention wherein the two tape strips are disposed together in the same area while obtaining the advantages of the compactness of the previously described embodiment. Components which are generally the same in this embodiment as those of the previously described embodiment have been identified by the same reference numerals. In some instances, for example in connection with the disposal drive mechanism 45, the components may be oriented slightly differently, however, the function is basically the same. In this embodiment, rather than the guide pin assembly 38 for rotating the protective strip that is removed as it passes next to the feed strip 12, a turning mechanism, indicated generally by the reference numeral 101 is employed. This mechanism 101 is disposed adjacent one side of the fed tape 12 and is comprised of a pair of fixed plates 102 and 103 that are mounted on the frame 27 by means of fasteners 104 and which serve the purpose of turning the protective covering strip 14 through a 90° angle and having it pass to the side of the fed tape 12.

Below the disposal feed mechanism 45, there are provided a pair of plates 105 and 106 mounted by respective screws 107 and 108 on the frame 27 for generally turning the removed strip 14 from a vertical direction toward a horizontal direction and into contact with the carrier strip 13.

The carrier strip 13 is returned to the disposal area by means of a direction mechanism, indicated generally by the reference numeral 111 that includes an upstanding plate 112 that receives the carrier strip 13 as it passes the feed roller 16 and turns it back in a direction opposite to the direction of feed. This redirected carrier strip 13 is passed between a pair of guide plates 113 and 114 rearwardly toward the back of the feed mechanism and toward the disposal area. This backing carrier is then turned into a further guide mechanism 115 that has a generally box shape as may be best seen in FIG. 8 and which directs the strip 13 back toward the removed protective strip 14. The adhesive can cause the strips to rejoin and thus move to a disposal area in the direction of the arrow 116. By virtue of this construction, the thin film-like protective strip 114 will not be likely to wind around any of the rollers and can be carried by the more rigid carrier strip 13.

It should be readily apparent from the foregoing description that the described embodiments of the invention are particularly effective in providing a very compact tape feeding and disposal mechanism and wherein the mechanism can operate on a generally continuous basis without stopping periodically to remove wound up covering strips. Furthermore, in one embodiment of the invention both the covering strip and carrier strip are rejoined and disposed simultaneously with obvious advantages. Of course, the foregoing description is that of preferred embodiments of the invention and various changes and modifications may be made without departing from the spirit and scope of the invention, as defined by the appended claims.

We claim:

1. A tape dispenser and disposal system comprising a tape feed means for feeding a tape comprised of a carrier strip and a removable covering strip in a generally horizontal direction to a stripping station, stripping means for removing said covering strip from said carrier strip and redirecting said covering strip in a direction generally opposite to the direction of said tape is fed by said feed means and above the fed tape, a disposal area beneath the tape being fed by said feed means, disposal means for transferring the removed covering strip from the area above the tape being fed to said disposal area comprising drive means rearwardly of said stripping means for drawing the removed covering strip in a downward direction and positioned beneath the area where said tape is fed, and stripping drive means positioned above the area where the tape is fed and for drawing the stripped covering strip away from said stripping means and toward said disposal means.

2. A tape dispenser and disposal system according to claim 1 further including means for rotating the covering strip through approximately 90° in the area where the covering strip passes vertically beneath the tape being fed.

3. A tape dispenser and disposal system according to claim 1 wherein the feed means comprise a pair of rollers engaged with opposite sides of the tape.

4. A tape dispenser and disposal system according to claim 3 wherein one of the rollers is spring biased for maintaining uniform tension on the tape.

5. A tape dispenser and disposal system comprising a tape feed means for feeding a tape comprised of a carrier strip and a removable covering strip in a generally horizontal direction to a stripping station, stripping means for removing said covering strip from said carrier strip and redirecting said covering strip in a direction generally opposite to the direction of said tape is fed by said feed means and above the fed tape, a disposal area beneath the tape being fed by said feed means, disposal means for transferring the removed covering strip from the area above the tape being fed to said disposal area comprising drive means rearwardly of said stripping means for drawing the removed covering strip in a downward direction and positioned beneath the area where said tape is fed, and carrier strip disposal means for redirecting the carrier strip to said disposal area for disposal along with the covering strip for rejoining with said covering strip before reaching said disposal area.

6. A tape dispenser and disposal system comprising a tape feed means for feeding tape comprised of a carrier strip and a removable covering strip in a generally horizontal direction to a stripping station, stripping means for removing said covering strip from said carrier strip and redirecting said covering strip in a direction generally opposite to the direction of said tape is fed by said feed means and above the fed tape, a disposal area beneath the tape being fed by said feed means, disposal means for transferring the removed covering strip from the area above the tape being fed to said disposal area, means for rotating the covering strip through approximately 90° in the area where the covering strip passes vertically beneath the tape being fed to the rear of said stripping means, means for rotating the covering strip back through 90° after it has passed the tape being fed to said disposal area, said disposal means comprising drive means for drawing the dispensed covering strip in a downward direction and positioned beneath the area where the tape is fed, said stripping drive means positioned above the area where the tape is fed and for drawing the stripped covering strip away from said stripping means and toward said disposal means.

7. A tape dispenser and disposal system according to claim 6 wherein the feed means comprises a pair of rollers engaged with opposite sides of the tape.

8. A tape dispenser and disposal system according to the claim 6 wherein one of the rollers is spring biased for maintaining uniform tension on the tape.

9. A tape dispenser and disposal system comprising a tape feed means for feeding tape comprised of a carrier strip and a removable covering strip in a generally horizontal direction to a stripping station, stripping means for removing said covering strip from said carrier strip and redirecting said covering strip in a direction generally opposite to the direction of said tape is fed by said feed means and above the fed tape, a disposal area beneath the tape being fed by said feed means, disposal means for transferring the removed covering strip from the area above the tape being fed to said disposal area, means for rotating the covering strip through approximately 90° in the area where the covering strip passes vertically beneath the tape being fed to the rear of said stripping means, carrier strip disposal means for redirecting the carrier strip to said disposal area for disposal along with the covering strip for rejoining with said covering strip before reaching said disposal area.

* * * * *

UNITED STATES PATENT AND TRADEMARK OFFICE
CERTIFICATE OF CORRECTION

PATENT NO. : 5,213,653
DATED : May 25, 1993
INVENTOR(S) : Akahori, et al

It is certified that error appears in the above-indentified patent and that said Letters Patent is hereby corrected as shown below:

Column 6, line 60, Claim 8, "the claim 6" should be --claim 7--.

Signed and Sealed this

Fifth Day of April, 1994

Attest:

BRUCE LEHMAN

Attesting Officer     Commissioner of Patents and Trademarks